(12) United States Patent
Kapoor et al.

(10) Patent No.: US 11,416,660 B1
(45) Date of Patent: Aug. 16, 2022

(54) AUTOMATIC PLACEMENT OF ANALOG DESIGN COMPONENTS WITH VIRTUAL GROUPING

(71) Applicant: Cadence Design Systems, Inc., San Jose, CA (US)

(72) Inventors: Preeti Kapoor, Noida (IN); Hui Xu, Wexford, PA (US); Hongzhou Liu, Sewickley, PA (US); Sravasti G. Nair, Fremont, CA (US)

(73) Assignee: Cadence Design Systems, Inc.

( * ) Notice: Subject to any disclaimer, the term of this patent is extended or adjusted under 35 U.S.C. 154(b) by 0 days.

(21) Appl. No.: 17/138,833

(22) Filed: Dec. 30, 2020

(51) Int. Cl.
   *G06F 30/31* (2020.01)
   *G06F 30/3308* (2020.01)
   *G06N 3/12* (2006.01)
   *G06F 30/392* (2020.01)

(52) U.S. Cl.
   CPC .......... *G06F 30/31* (2020.01); *G06F 30/3308* (2020.01); *G06F 30/392* (2020.01); *G06N 3/126* (2013.01)

(58) Field of Classification Search
   CPC ..................................................... G06F 30/31
   USPC .......................................................... 716/124
   See application file for complete search history.

(56) References Cited

U.S. PATENT DOCUMENTS

| | | | | |
|---|---|---|---|---|
| 6,493,658 B1 * | 12/2002 | Koford | ................ | G06F 30/392 703/1 |
| 2009/0235219 A1 * | 9/2009 | Lin | ...................... | G06F 30/392 716/119 |
| 2021/0334445 A1 * | 10/2021 | Goldie | ..................... | G06N 3/08 |

OTHER PUBLICATIONS

Balasa, F., et al., "Module Placement for Analog Layout Using the Sequence-Pair Representation," Conexant Systems, dated 1999.
Tirumalai, N., "LCPlace: A novel VLSI placement methodology based on large cluster formation," B.E. Visvesvaraya Technological University, dated Mar. 2008.
Xu, B., et al., "Device Layer-Aware Analytical Placement for Analog Circuits," Association for Computing Machinery, Copyright 2019.
Graeb, H., et al., "Analog Layout Synthesis—Recent Advances in Topological Approaches," dated Apr. 2009.
Wahby, M., "Component placement tips and strategies," edn.com, dated Feb. 21, 2014.
Xiao, L., et al., "Practical Placement and Routing Techniques for Analog Circuit Designs," The Chinese University of Hong Kong, dated 2010.
"OrCAD Layout® Autoplacement User's Guide," OrCAD, Inc., Copyright 1998.
Vidal-Obiols, A., "Algorithmic Techniques for Physical Design: Macro Placement and Under-the-Cell Routing," Computer Science Department Universitat Politécnica de Catalunya, dated Nov. 2019.
"Advanced Design System 2011.01: Schematic Capture and Layout," Agilent Technologies, dated Feb. 2011, pp. 134-163.

* cited by examiner

*Primary Examiner* — Eric D Lee
(74) *Attorney, Agent, or Firm* — Vista IP Law Group, LLP

(57) ABSTRACT

Disclosed is an improved approach to implement analog or mixed-signal designs. A method, system, and computer program product are provided to fully automate the analog placement step using a virtual grouping methodology which considers variable components and uses a genetic placement algorithm to find the best placement solution which fully respects the analog constraints defined by a user or auto identified by a tool.

20 Claims, 9 Drawing Sheets

AUTOMATIC PLACEMENT OF ANALOG DESIGN COMPONENTS WITH VIRTUAL GROUPING

BACKGROUND

The invention is directed to an improved approach for designing, analyzing, and manufacturing electronic circuitry. Circuit designs may include digital circuitry, analog circuitry, or a combination of both analog and digital portions.

The process of designing and implementing circuit designs, particularly for analog or mixed-signal environments, have become more complicated over time due to the need to squeeze ever more functionality onto the floorplan of integrated circuit (IC) chips that are steadily decreasing in size. For advanced technology nodes having very small feature sizes, it has become very challenging to implement layouts especially in the presence of non-uniformities in the design.

The issue addressed by the present disclosure is that a design that includes analog and/or mixed-signal circuitry may need to consider multiple variable factors. These variables create significant challenges in terms of DRC (design rule checking) correctness along with design constraints and connectivity driven flows. It is especially difficult to implement an advanced node design with all these variable components that complies with tight DRC rules.

The conventional approach to address these challenges when faced with significant non-uniformities is to implement analog designs using a manual placement approach. The problem is that the manual placement approach is highly inefficient (e.g., could take 2-3 engineer days for an average analog block consisting of 100-150 devices) and is prone to human design errors. These drawbacks severely limit the scalability and flexibility for performing analog designs using known methodologies.

Therefore, there is a need for an improved approach to implement analog designs for electronic circuits.

SUMMARY

Some embodiments provide an improved approach to implement analog and/or mixed-signal designs. According to some embodiments, a method, system, and computer program product are provided to fully automate the placement step using a virtual grouping methodology which considers some/all variable components and uses a genetic placement algorithm to find the best placement solution which fully respects the analog constraints defined by a user or auto-identified by a tool.

Other and additional objects, features, and advantages of the invention are described in the detailed description, figures, and claims.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Various embodiments are described hereinafter with reference to the figures. It should be noted that the figures are not necessarily drawn to scale. It should also be noted that the figures are only intended to facilitate the description of the embodiments, and are not intended as an exhaustive description of the invention or as a limitation on the scope of the invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments," in various places throughout this specification are not necessarily referring to the same embodiment or embodiments.

As noted above, an issue addressed by the present disclosure is that an analog design may include multiple variable factors. Examples of such factors include, without limitation: (a) MOS (metal-oxide semiconductor) width; (b) MOS gate length; (c) Bulk connections; (d) Multi Vt (multiple threshold voltages); (d) Standard Cells and Passive components. These variables create significant challenges in terms of DRC correctness along with design constraints and connectivity driven flows.

One major reason for this problem is the inherent design methodologies being pursued by analog designers. Analog designs tend to take advantage of possible MOS size combinations or voltage level variations to have best performing circuits. This increases the number of variable components and thus automation becomes more challenging and complex.

Embodiments of the invention provide an improved approach to implement analog designs using the concept of "virtual groups".

Figure 1:
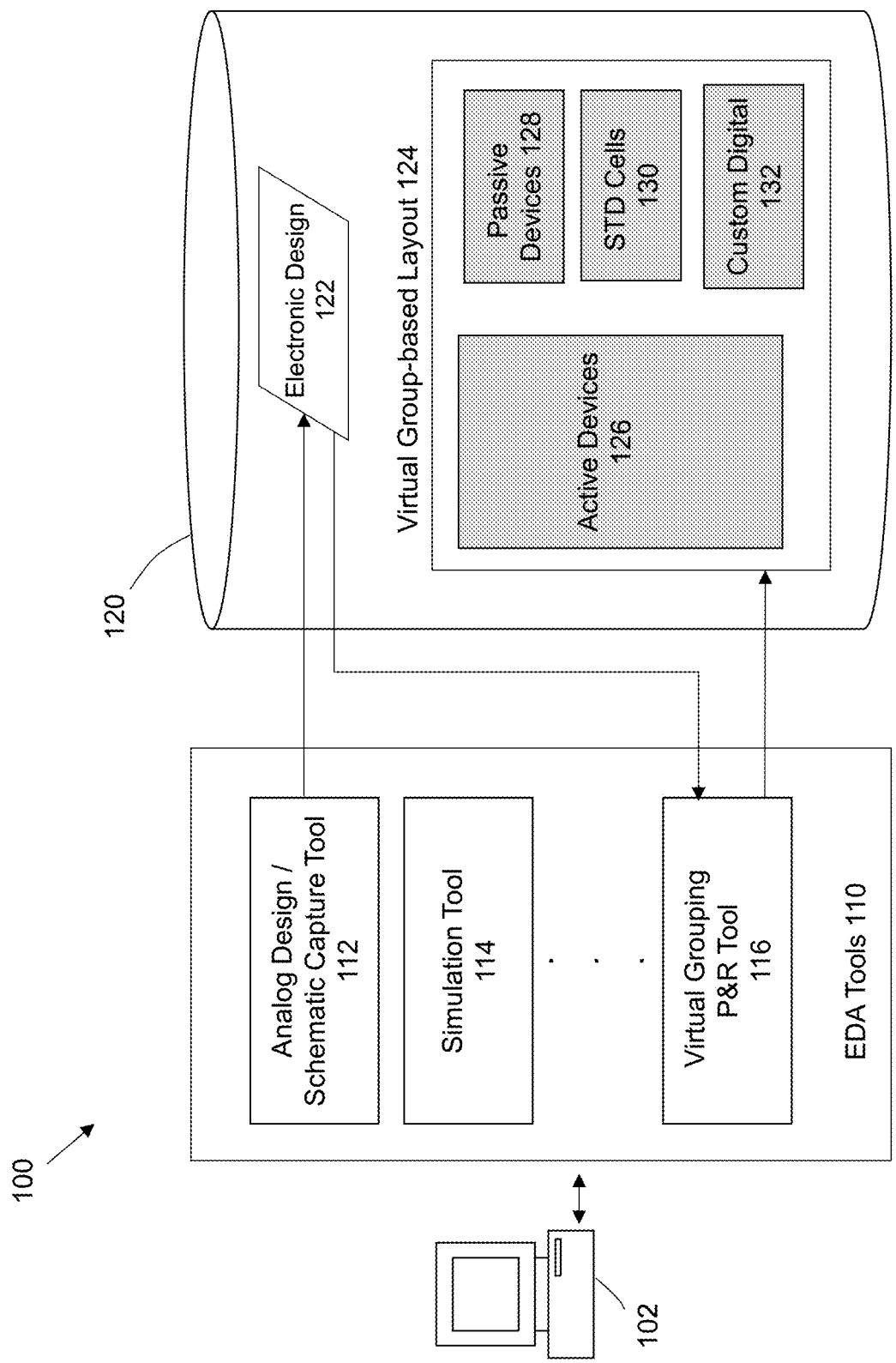
FIG. 1 illustrates an example system which may be employed in some embodiments of the invention.

FIG. 1 illustrates an example system 100 which may be employed in some embodiments of the invention to implement placement with virtual groups. System 100 includes one or more users that interface with and operate a computing system to control and/or interact with system 100 using a computing station 102. Such users include, for example, electronic designers and engineers. The computing station 102 and any underlying computing device that facilitates any aspect of system 100 (such as a computing system that implements EDA (electronic design automation) tools 110) comprise any type of computing apparatus that may be used to operate, interface with, or implement one or more EDA systems/applications. Examples of such computing systems include for example, servers, workstations, personal computers, or remote computing terminals connected to a networked or cloud-based computing platform. The computing system may comprise one or more input devices for the user to provide operational control over the activities of the system 100, such as a mouse or keyboard to manipulate a pointing object.

One or more design tools, such as EDA software tools 110, may be used to assist in the design process for an electronic product design 122. Chip design using EDA software tools generally involves an iterative process whereby the chip design is gradually perfected. A top-down design methodology is commonly employed, by which the designer creates an integrated circuit by hierarchically defining functional components of the circuit, and then decomposing each component into smaller and smaller components. The various components of an integrated circuit are initially defined by their functional operations and relevant inputs and outputs. For an analog circuit design, an analog design tool and/or schematic capture tool 112 may be used to generate a specific circuit implementation of a design. The design may then be simulated and/or functionally verified by one or more simulation tools 114, e.g., where the electronic design is converted into a system of equation(s), which is then solved for a given set of inputs to check the state of specific portions of the circuit at given points in time.

A physical representation of the circuit design may be implemented by having the circuit components being "placed" (e.g., given specific coordinate locations in the circuit layout) and "routed" (e.g., wired or connected together according to the designer's circuit definitions). In the area of custom designs, the user can directly and interactively conduct placement and routing in a manual approach, e.g., by manually manipulating the location of objects. In addition, after an initial placement/routing process that may have undergone either auto-placement or interactive placement, the layout may still undergo additional interactive changes to the existing placement of objects, by potentially inserting or moving objects in portions of the layout.

With some embodiments of the invention, a virtual grouping place and route tool 116 is provided to automate the analog placement step using a virtual grouping methodology. As discussed below, this mechanism considers the variable components and uses a genetic placement algorithm to find the best placement solution which fully respects the analog constraints defined by a user or auto identified by a tool.

This results in the generation of a layout 124 where components on the layout have been organized, for example, into a first virtual group 126 (or a first set of virtual groups) for active devices, a second virtual group 128 (or a second set of virtual groups) for passive devices, a third virtual group 130 (or a third set of virtual groups) for standard cells, and a fourth virtual group 132 (or a fourth set of virtual groups) for custom digital components.

The electronic design data 122 and or layout data 124 may be stored in a computer readable storage medium 120. The computer readable storage medium 120 includes any combination of hardware and/or software that allows for ready access to the data that is located at the computer readable storage medium 120. For example, computer readable storage medium 120 could be implemented as computer memory and/or hard drive storage operatively managed by an operating system, and/or remote storage in a networked storage device, such as networked attached storage (NAS), storage area network (SAN), or cloud storage. The computer readable storage medium 120 could also be implemented as an electronic database system having storage on persistent and/or non-persistent storage.

Figure 2:
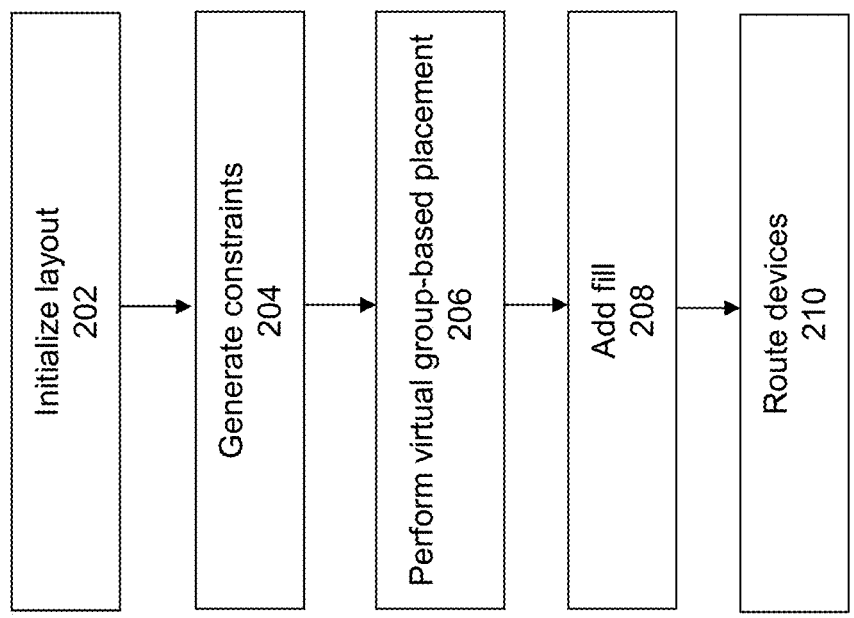
FIG. 2 shows a flowchart of an approach to implement some embodiments of the invention to operate the virtual grouping place and route tool.

FIG. 2 shows a flowchart of an approach to implement some embodiments of the invention to operate the virtual grouping place and route tool. At step 202, a layout is initialized by the tool. This action reads in a design file and initializes a floorplan for the electronic design.

At 204, a set of constraints are generated for the design process. The design constraints describe and define intents, guidelines, and parameters for a design. For example, electrical and thermal design constraints are specified and then transformed into physical constraints for layout to ensure those domains perform as intended. Physical layout constraints can also be derived from circuit patterns or extracted layout netlists. Example constraint types may include, for example, alignment, symmetry, device orientation matching, device parameter matching, and/or cluster constraints. Compliance with design constraints is necessary to ensure that the resulting function of a final physical IC product matches the intended performance of the product.

At 206, placement is then performed for the design by organizing components of the design into virtual groups. In a first stage of this approach, the design components are separated into smaller units, where the units include, for example, a virtual group for active devices, a virtual group for passive devices, a virtual group for standard cells, and/or a virtual group for custom digital components. In a second stage of processing, the components are precisely placed for the components based upon certain defined variable factors, as described in more detail below. It is these actions where the tool uses the variable factors to automatically place the components—even in the presence of non-uniformities—that makes the current approach much more efficient and effective as compared to conventional design tools (where conventional design tools require significant manual efforts by a designer to look at the multiple variables to see how the components should fit together on the layout). It is noted that with certain embodiments, interactivity can be provided to the user to review the logical groupings that have been created, and to provide flexibility or editing the compositions of the groups or the way that components are placed within the groups.

The approach automatically extracts the variable components in layers not visible to the user, and will apply user defined and/or auto detected analog constraints which in turn generate symmetrical clusters (area utilization) which can be put together to achieve a routing friendly placement with an evolved wire length calculation model that takes into account the current flow in the circuit which generally drives the placement direction. This placement model will not expect any existing rows or WSPs (width spacing patterns) but will instead be based on the placement result. The approach exports rows and local WSPs for the user which can further be used in design completion.

At step 208, fill is added to the layout. In advanced node designs, metal fill (also referred to as "dummy fill") is added to a layout to address density and device matching requirements. This helps to maintain layer planarity during the manufacturing processes for the electronic product (e.g., during chemical mechanical polishing or "CMP").

At step 210, the devices are routed on the layout. This action adds the necessary wiring shapes onto the layout to properly connect the devices on the layout to each other to fulfill the functional requirements for the circuit components.

This approach therefore corrects significant problems with conventional approaches to implement placement for analog circuits. With conventional placement tools—for automated placement to be usable—the design must embody certain uniformities, such as where the height of all P/N devices are the same or very close, that a global uniform row can be created, that the passive devices can also fit into this global rows, and/or that the poly pattern (width and pitch) of all P/N devices are the same. However, since many analog designs include significant non-uniformities, this means that conventional tools cannot operate effectively or efficiently in an automated manner, and hence forces the designer to undergo a highly manual process to create the design layout. Such non-uniformities may include, for example, where the designer uses different device types, sizes and bulk connections, where one global row region is not feasible, where passive devices have large variations and cannot be snapped inside a P/N device row region, and/or where different bulk pins cannot be routed.

With the present embodiments of the invention, by organizing the design components into virtual groups and performing placement together on a virtual-group-basis for these components, this allows a fully automated approach to be taken to place and route the design while complying with all DRC rules and/or analog design constraints. This facilitates the layout to be implemented inline with appropriate design constraint methodologies followed by analog layout designers, and can be used to obtain significant productivity gains in the design cycles of analog blocks with help of a fully automated flow. The current methodology can be used to cover the entire spectrum of technology ranging from mature nodes to advanced nodes.

Figure 3:
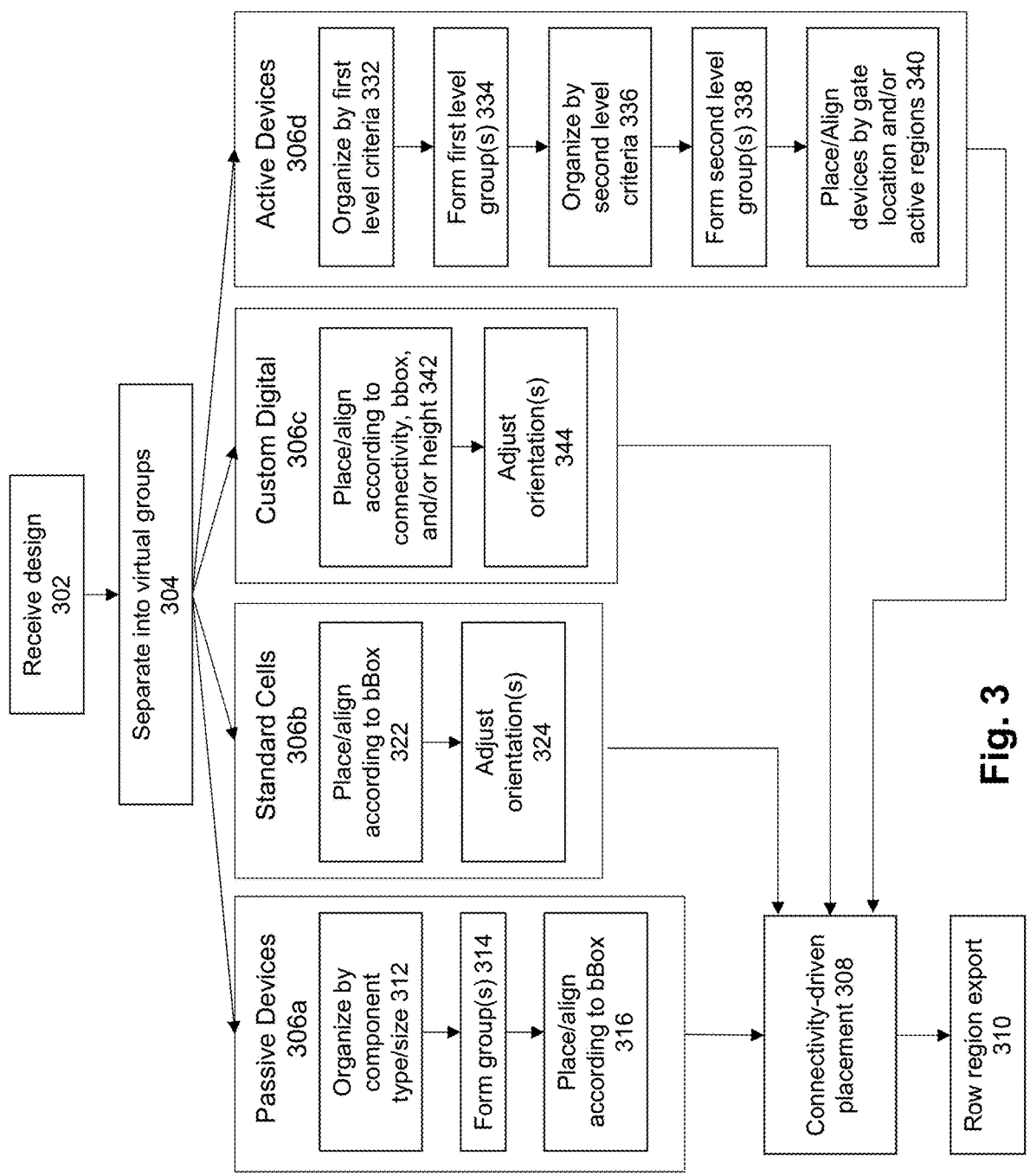
FIG. 3 shows a more detailed flowchart of an implementation of virtual grouping based placement according to some embodiments of the invention.

FIG. 3 shows a more detailed flowchart of an implementation of virtual grouping based placement according to some embodiments of the invention. At 302, the electronic design is received for placement onto a layout. The electronic design may include multiple types of devices and components suitable for an analog or mixed signal design.

At 304, the components in the design are separated into different sets of virtual groups, including at least one or more of a passive device virtual group 306a, a standard cell virtual group 306b, a custom digital virtual group 306c, and/or an active device virtual group 306d. It is noted that in many analog or mixed-signal designs, these four types are the main components of the design. However, to the extent that a design may have additional main components, then the inventive concept described herein may be extended to include one or more additional virtual groups as appropriate to address those other components.

The groups are referred to as "virtual groups" because the groupings are a concept that likely does not exist as a real construct within a schematic. As such, an ordinary conventional layout will not see any actual demarcations of the components into these virtual component groups. However, with embodiments of the invention, such organizations will occur for the components into the virtual groups for placement purposes.

For the passive device virtual group 306a, the passive devices can be further segregated at step 312 into additional groups based at least in part upon additional criteria. For example, the passive device can be organized into separate groups based upon the devices having different sizes, different device types, and/or any combination of size and type. At step 314, the segregated devices can be organized into their respective virtual group(s). The devices within the groups can thereafter be placed and/or aligned as appropriate. For example, at step 316, the devices can be placed and aligned according to the device's bounding box (bBox) bottom right point. In some embodiments, the placement of the devices should be as compact as possible.

Figure 4:
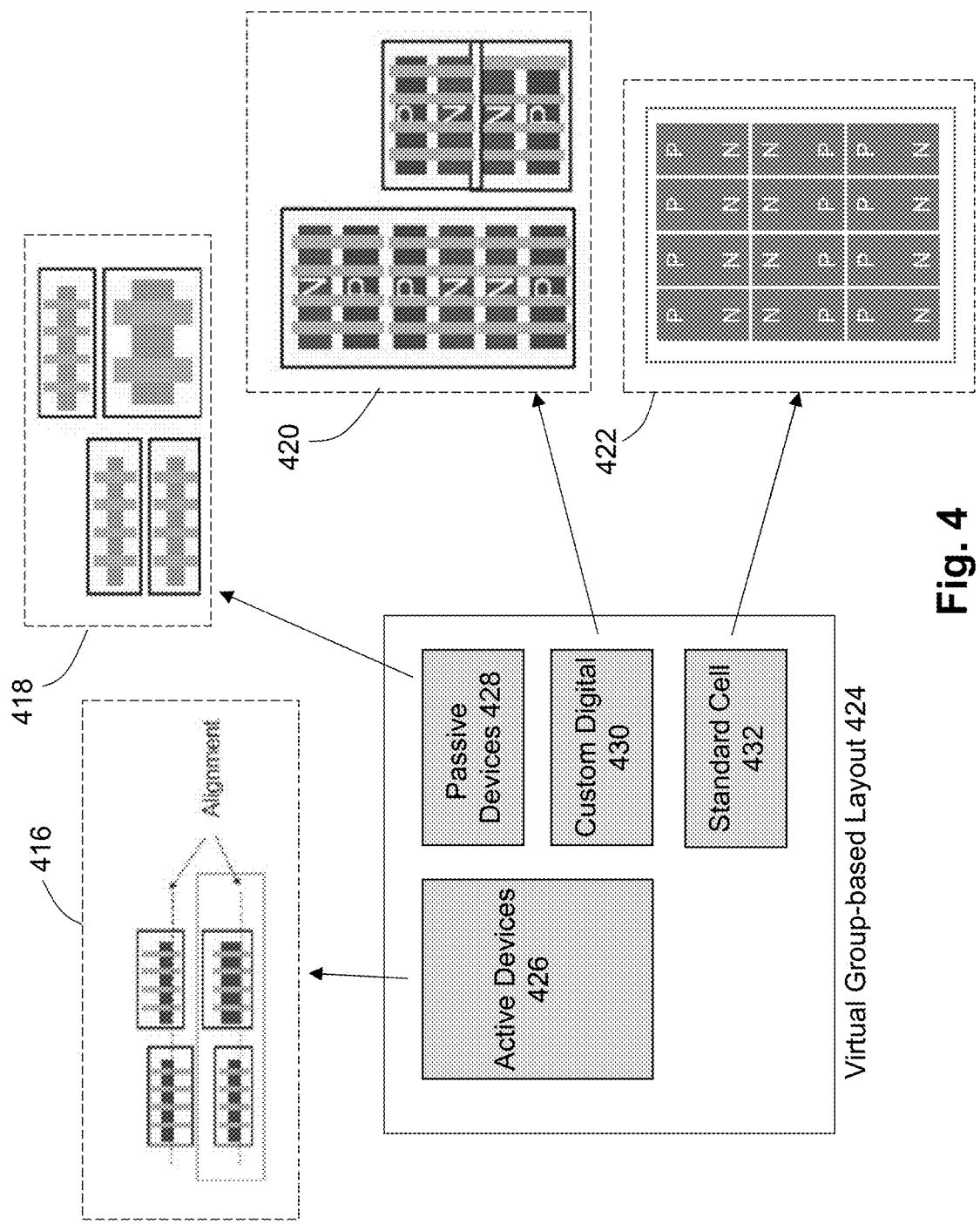
FIG. 4 illustrates an example layout.

By way of illustration, consider the virtual-group-based layout 424 shown in FIG. 4. This layout 424 includes an active device virtual group 426, a passive device virtual group 428, a custom digital virtual group 430, and a standard cell virtual group 432.

For the passive device virtual group 428, the figure shows an illustration of several types of passive devices 418. It can be seen that these devices are aligned according to the bottom edge of the bounding boxes for these devices.

For the standard cell virtual group 306b, the standard cells are, at step 322, placed and aligned according to the device's bounding box (bBox) bottom right point. In addition, at step 324, the orientation of the standard cells adjusted to be in alignment with each other. This is because there could be multiple heights for the different cells with their own different cell boundaries. The orientations of the cells are aligned together such that P regions for a first cell are aligned with other P regions in a second cell, and N regions in the first cell are also aligned with N regions in the second cell. In addition, the power and ground rails will also be aligned between the different cells.

Consider the example layout 424 shown in FIG. 4. Here, the illustration shows a grouped set of standard cells 422. The bounding boxes for the cells are aligned based upon their bottom edges. In addition, the cells are oriented such that P in the first cell is aligned with P in the second cell, and similarly, N in the first cell is aligned with N in the second cell. In particular, for the first row on the bottom, this may for example comprise a R0 or MY orientation, with P on top and N on the bottom. For the second row in the middle, this may for example comprise MX or R180 orientation, with N on top and P on the bottom, For the third row at the top, this may for example comprise R0 or MY orientation, with P on top and N on the bottom.

For the custom digital virtual group 306c, the custom digital components are, at step 342, placed and aligned according to the device's bounding box (bBox), e.g., using the bottom right point of the box. In addition, at step 344, the orientation of the custom digital components adjusted to be in alignment with each other. This is because there could be multiple heights for the different components with their own receptive boundaries. The orientations are aligned together such that P regions for a first custom digital component are aligned with the P regions in a second custom digital component, and N regions in the first custom digital component are also aligned with N regions in the second custom digital component. In addition, the power and ground rails will also be aligned as well.

Consider the example layout 424 shown in FIG. 4. The illustration shows sets of custom digital devices 420 with respect to the rectangles marked with either "P" or "N". Here, the bounding boxes are aligned based upon their bottom edges. In addition, even though the heights may be different, the components are oriented such that P in the first component is aligned with P in the second component, and similarly, N in the first component is aligned in N in the second component.

For the active device virtual group 306*d*, the active devices are organized based upon multiple levels of criteria. At step 332, the active devices are organized by a first level criteria. For example, the first level criteria can be specified by gate length, where the active devices are segregated based upon the gate length of a given active device. A first level of virtual grouping then occurs, at step 334, based upon gate length to create the different virtual groups. At step 336, the active devices are organized by a second level criteria. For example, the second level criteria can be based upon the height of the active device, where the active devices are segregated based upon the active device's height. At step 338, the second level groups are then formed based upon the criteria from step 336 (e.g., device height). At step 340, for active device virtual groups, the active devices are placed and aligned according to their gate locations and active regions, where multiple heights will bottom align by default in some embodiments.

In the example layout 424 shown in FIG. 4, the illustration shows grouped active devices 416. Here, it can be seen that the grouped active devices are aligned based upon their gate locations and active regions.

After the formation of the virtual groups, connectivity-driven placement then occurs at step 308. As discussed in more detail below, a genetic placement algorithm may be used to implement placement of the virtual groups.

It is noted that the placement activities may occur using design tools that employ a row-based environment for performing placement. The row regions may be based upon row templates that have either uniform or non-uniform rows in a layout design, where the template includes information about: (a) height of the row template; (b) number of rows in the row template; (c) heights of the rows; (d) types of devices that can be placed within each row, including their orientations and alignment references; and/or (e) rail definitions within each row. The templates are used to generate row regions, where the row region can be drawn in an entire PR boundary or in a specific part of the PR boundary to allow multiple row regions within a single PR boundary. The term "PR boundary" refers to a layer that the place and route tools will use for placing cells. While the row template determines how rows are to be created in the region, a row region may contain repetitions of the row template based on the height of the row region or as per the user specifications. Row attributes determine the types of instances that can be placed in each row and the manner in which they must be placed by creating row region objects in the layout. One or more objects (e.g., devices/components such as standard cells) for the layout may be placed into the rows. Automatic placement may occur, for instance, to place cells into the rows, e.g., to optimize wirelengths and constraints. Devices may be snapped to rows and/or snap patterns. Dummy fill may also be placed, e.g., where the dummy fill is included into the spaces within rows. For example for standard cells, filler cells may be inserted into the empty spaces between the standard cells. In addition, custom fill cells may also be used, e.g., where custom fill cells are inserted in the empty spaces between transistors for transistor-level designs. After placement with a row-based paradigm, at step 310, row region exports may then be performed.

Figure 5:
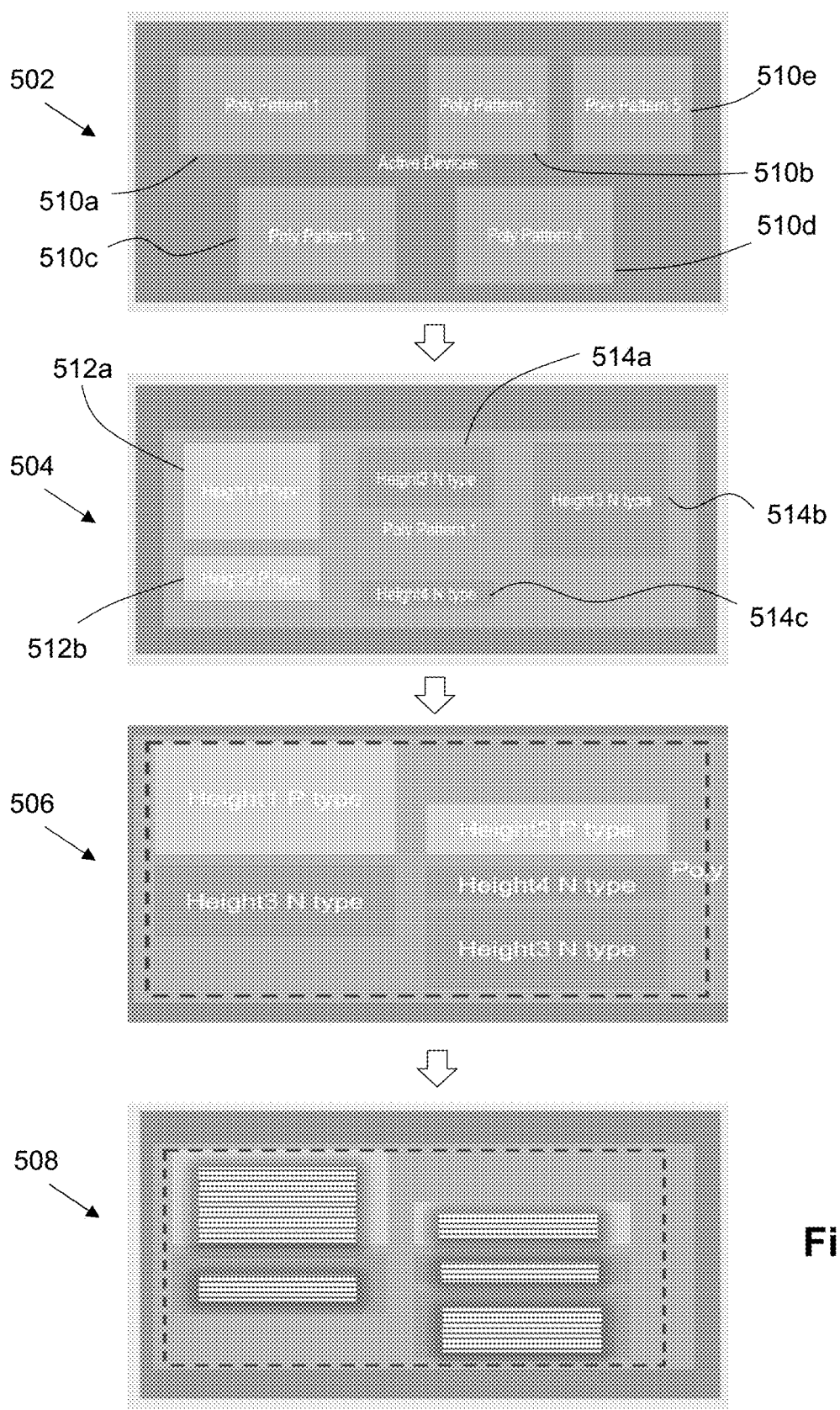
FIG. 5 provides an illustration of an example approach to implement multi-level grouping for active devices according to some embodiments of the invention.

FIG. 5 provides an illustration of an example approach to implement multi-level grouping for active devices according to some embodiments of the invention. Window 502 shows a first level of grouping that may be applied to active devices. Here, the active devices are organized into five separate groups based upon a first level grouping criteria, e.g., poly pattern grouping where gate length/width is used as the criteria for separating the different devices into their corresponding groups. In particular, group 510*a* is created for a first poly pattern, group 510*b* is created for a second poly pattern, group 510*c* is created for a third poly pattern, group 510*d* is created for a fourth poly pattern, and group 510*e* is created for a fifth poly pattern.

The contents of each of the first level groups can then be further sub-organized into one or more second level sub-groups. Window 504 shows a second level of grouping that may be applied to the active devices from one of the groups from window 502. Here, the active devices from a first level group are organized into five separate second level sub-groups based upon a second level grouping criteria, e.g., based upon device type (P or N) and/or device height. In particular, sub-group 512*a* is created for a first group of P-type devices having a first height parameter, sub-group 512*b* is created for a second group of P-type devices having a second height parameter, sub-group 514*a* is created for a first group of N-type devices having a first height parameter, sub-group 514*b* is created for a second group of N-type devices having a second height parameter, and sub-group 514*c* is created for a third group of N-type devices having a third height parameter.

Next, as shown in window 506, a placement step is performed to place the sub-groups onto the layout. In some embodiments, a connectivity-driven placement approach is employed to implement the placement of the P/N type groups. For example, as described in more detail below, a genetic placement approach can be employed to implement placement of the different groups and sub-groups. This is followed by row realization placement for each of the groups and sub-groups, as shown in window 508.

It is noted that while the above illustrative groupings were described with respect to gate length and height, any suitable criteria may be applied to organize the different groups and sub-groups. For example, bulk connections, multi Vt factors, and other variables may also be considered instead of, or in addition to, the variables discussed above with respect to FIG. 5.

According to some embodiments of the invention, a genetic placement algorithm can be employed to implement placement of the virtual groups. A genetic placement algorithm is where the placement activities undergo multiple generations of changes to the possible placement configurations, and where each generation of a configuration can be mutated and/or joined with other configurations to generate new (and hopefully better) configurations in subsequent generations. The goal is to have each following generation provide a better result until no further improvements can be demonstrated by further evolution of the placement configurations.

Figure 6A:
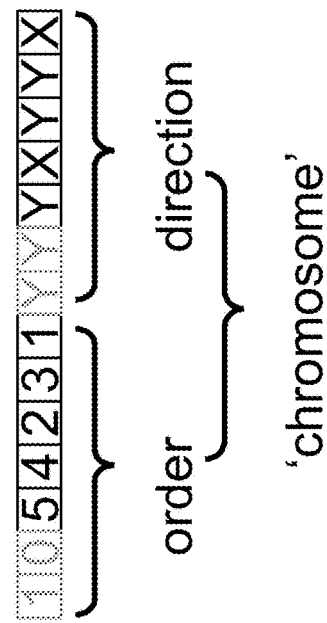
FIG. 6A shows an example data structure that can be used in some embodiments of the invention.

In some embodiments, each possible specification of a placement configuration can be represented as a "chromosome" data structure. FIG. 6A shows an example data structure 602 that can be used in some embodiments of the invention. The data structure includes multiple separate portions, including portion 604 that identifies a virtual group order, portion 606 that identifies an instance order, portion 608 that identifies a virtual group direction, and portion 610 that identifies instance directions.

In general, the chromosome data structure indicates how block are to be placed, where it indicates whether the blocks should be inserted to the right or upwards from an existing block. The sequence of items within the data structure 602, and the specification designation of "Y" or "X" in those fields, will guide the placement of the blocks.

Figure 6B:
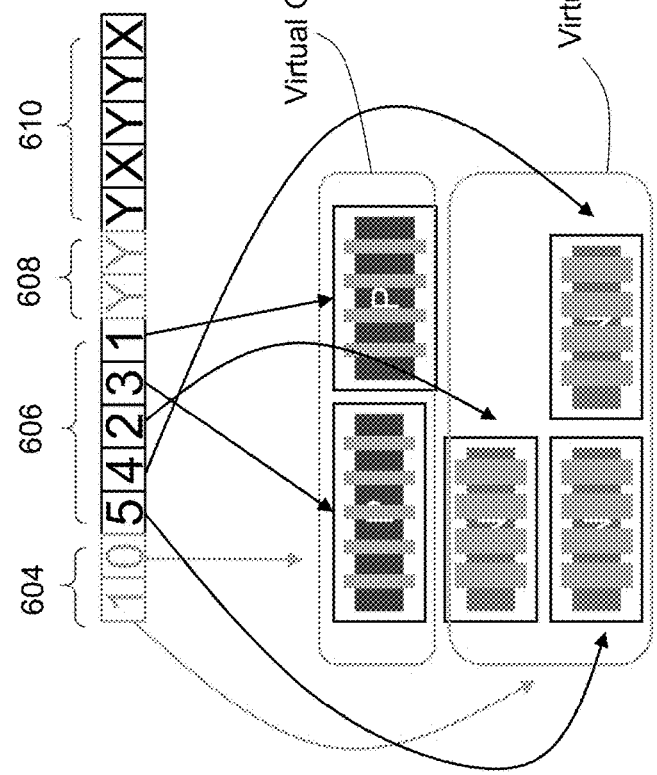
FIG. 6B shows an illustration of how the data structure can be used to define the configuration of virtual groups.

FIG. 6B shows an illustration of how this data structure 602 can be used to define the configuration of virtual groups. In particular, the sequence of identifiers within portion 604 describe the order in which the virtual groups are to be placed, as shown in the figure. Within each virtual group, portion 606 identifies the order of the instances that are placed. From portion 608, one can derive the direction of the virtual groups, where "Y" indicates a vertical direction and "X" indicates a horizontal direction. Portion 610 also uses the "Y" and "X" designations to determine the direction of the instances within the virtual groups.

Figure 6C:
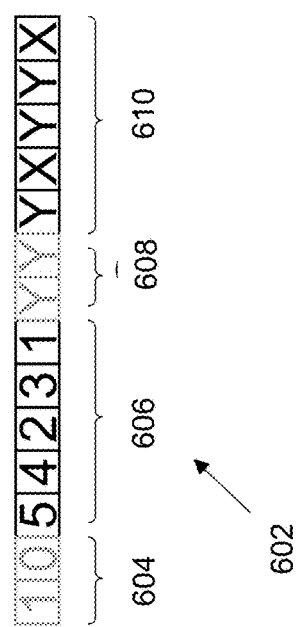
FIG. 6C shows how the chromosome data structure can be used to define the order and direction of a given placement configuration.

As illustrated in FIG. 6C, the chromosome data structure can essentially be used to define the order and direction of a given placement configuration. The key for the current disclosure is that the data structure includes portions to define both order and direction on the basis of the virtual groups, in addition to the instances within the virtual groups.

Figure 6D:
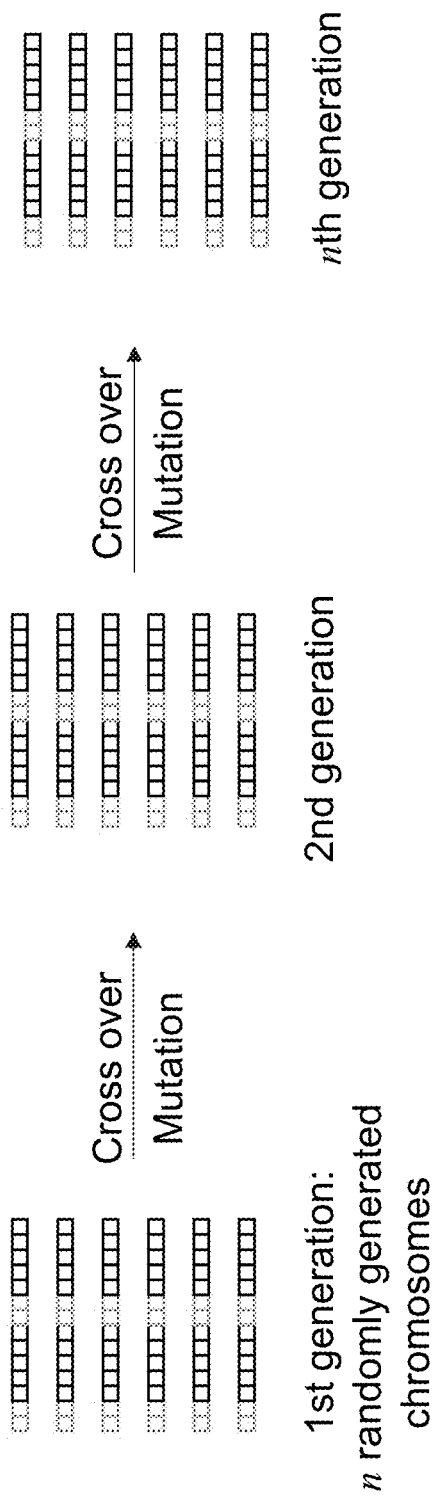
FIG. 6D illustrates the process of using the data structure to implement a genetic placement algorithm.

FIG. 6D illustrates the process of using this data structure to implement a genetic placement algorithm. In particular, the placement configurations at each generation of the chromosomes can be represented using the chromosome data structure. Changes may be applied to the chromosomes at succeeding generations. For example, cross-over mutations may be implemented by effecting corresponding changes to the chromosome data structure at each generation of the genetic algorithm. Since each combination represented by a chromosome data structure is a combination of an order and direction that is mapped to a placement result, the mutations of these structures can be used to find the best solution based on order and direction. This approach evaluates each chromosome in each generation, to make sure the best chromosome in each generation is always better than its ancestors. The best solution the algorithm finds is the best chromosome in the last generation.

A cost-based approach can be used to determine the quality of the placement for each generation, and their improvements (or not) from each succeeding generation of configurations, where the cost-based approach will be used to limit the genetic material for worse outcomes but promote the genetics of configurations having better outcomes. One type of cost that can be considered in some embodiment is a cost based upon wirelength, where a wirelength model will be used to indicate a higher cost for configurations that correspond to longer wirelengths and a lower costs for configurations that correspond to shorter wirelengths.

As previously stated, the goal is to have each following generation provide a better result until no further improvements can be demonstrated by further evolution of the placement configurations, e.g., based upon the wirelength cost model. By the end of the placement procedure, the placement result should be a placement configuration having the lowest calculated cost.

An example approach to implement a genetic placement algorithm is disclosed in U.S. application Ser. No. 16/238,274, filed on Jan. 2, 2019, entitled "System, Method, and Computer Program Product for Analog and Mix-Signal Circuit Placement", which is hereby incorporated by reference in its entirety.

Figure 7:
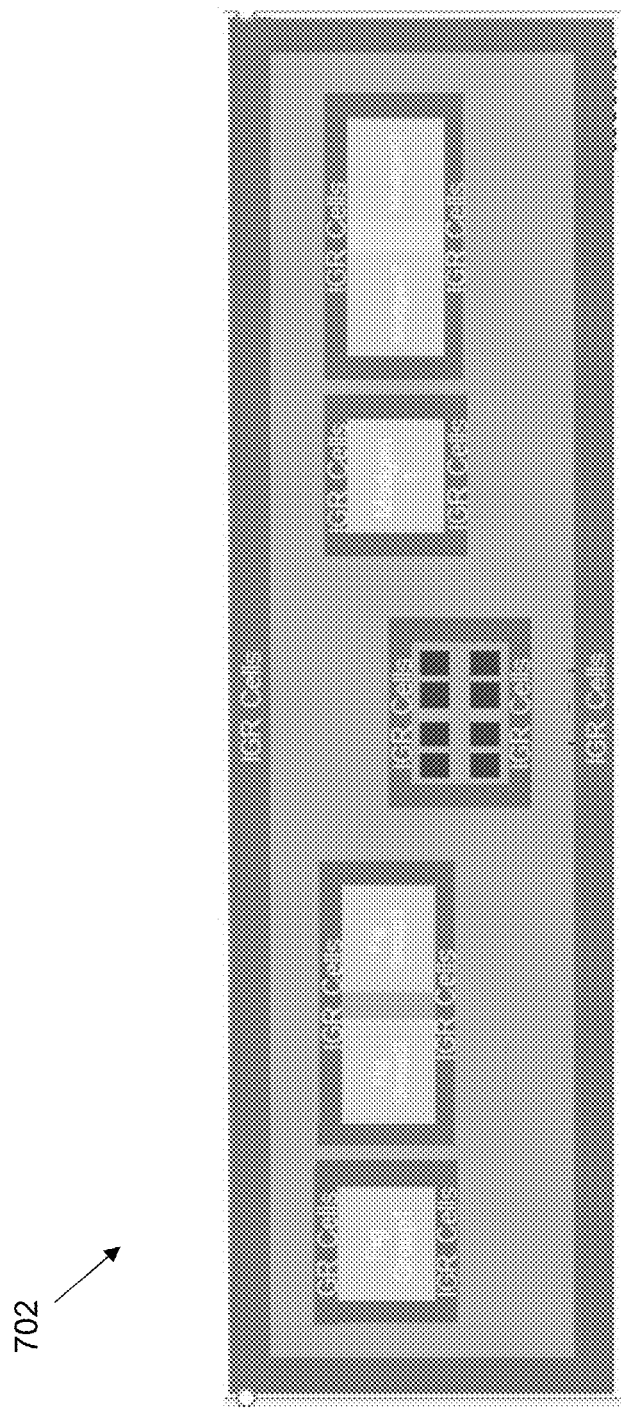
FIG. 7 illustrates the design completion steps that include the creation of guard rings.

As shown at 702 in FIG. 7, the design completion steps may include the creation of guard rings (GRs). The possible GR attributes inside each virtual group (VG) may include: (a) around each Fig. Group or shared around Fig Groups, (b) around individual modgen or shared around modgen group, and/or (c) around each VG or around groups of instances. A "modgen" refers to a module generator for a EDA tool, where a template may be employed to create a.

The guard ring creation action can be considered as a pre-placement step. This can be a semi-automatic flow, with, for example: (a) mode 1—none by default or (b) mode 2—which generates around all virtual groups. Each modgen can have independent GRs as part of a modgen constraint. The ring generated by a placer around VGs can be an independent fig group.

Therefore, what has been described is an improved approach to implement analog designs. This provides a fully automated approach to implement the analog placement step using a virtual grouping methodology which considers variable components and uses a genetic placement algorithm to find the best placement solution which fully respects the analog constraints defined by a user or auto identified by the tool.

This allows for a DRC-clean fully automatic placement of the analog design. This approach is also inline with design constraint methodologies followed by analog layout designers. This approach allows for significant gains in efficiencies (e.g., productivity gains in the design cycle of analog blocks with the help of a fully automated flow). The methodology can be used to implement the entire spectrum of technology ranging from mature nodes to advanced nodes. This approach also provides routing-friendly placement with a redefined wirelength calculation model.

System Architecture Overview

Figure 8:
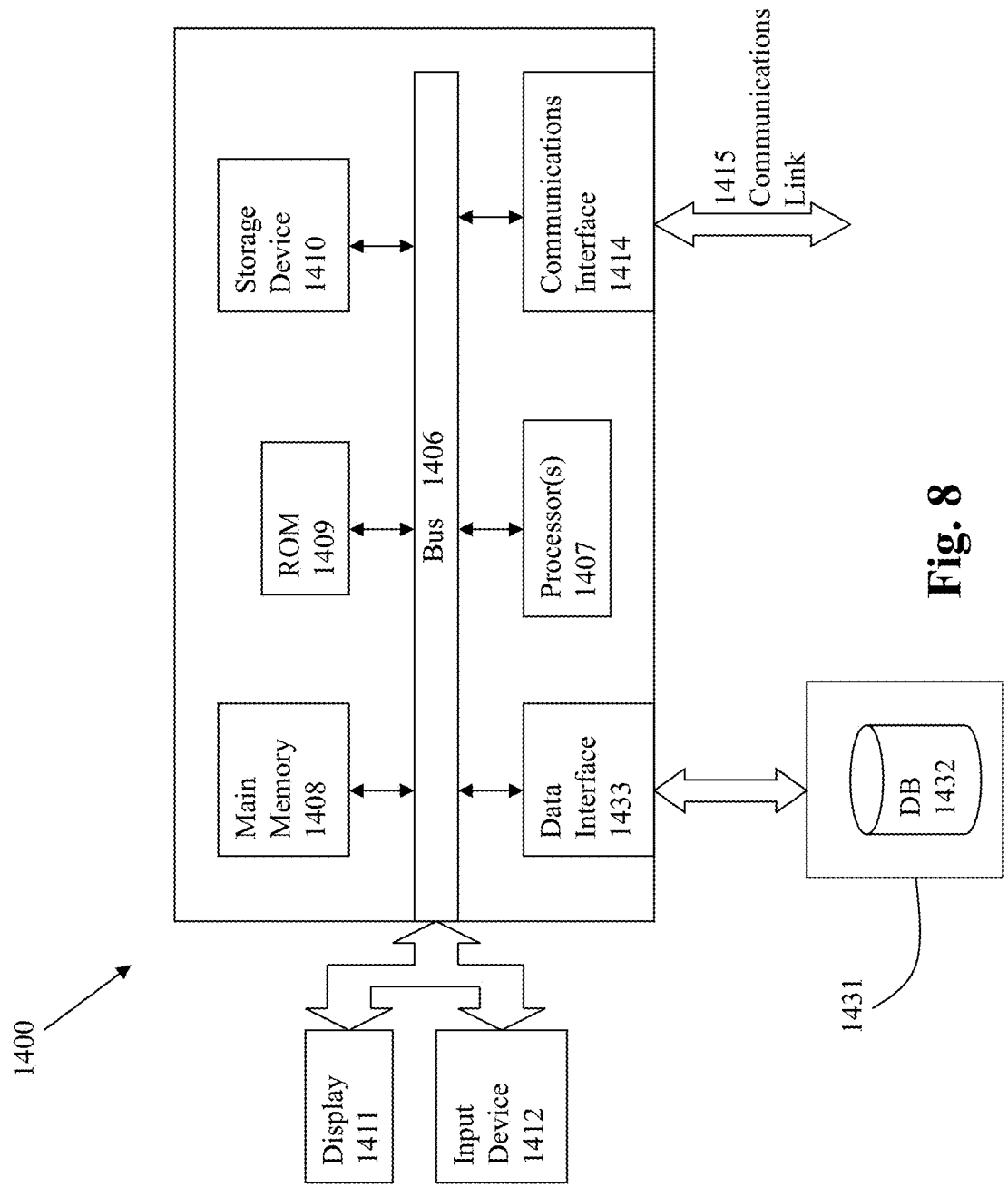
FIG. 8 is a block diagram of an illustrative computing system suitable for implementing an embodiment of the present invention.

FIG. 8 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media.

Non-volatile media includes, for example, optical or magnetic disks, such as disk drive 1410. Volatile media includes dynamic memory, such as system memory 1408. A database 1432 may be accessed in a computer readable medium 1431 using a data interface 1433.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method, comprising:
   receiving an electronic design;
   organizing components of the electronic design into multiple virtual groups, wherein a first virtual group is organized to include all active devices from the electronic design, a second virtual group is organized to include all passive devices from the electronic design, and a third virtual group is organized to include all standard cells from the electronic design; and
   performing placement of the electronic design by separately placing components for each of the first, second, and third virtual groups according to placement and alignment rules for each of the respective virtual groups.

2. The method of claim 1, wherein the active devices of the first virtual group are placed in a layout by organization into a first level virtual group according to a first level grouping criteria, and wherein active devices in the first level group are organized into one or more second level virtual groups based upon a second level grouping criteria.

3. The method of claim 2, wherein first level grouping criteria corresponds to gate length and the second level grouping criteria corresponds to at least one of device type or device height.

4. The method of claim 1, wherein the components are aligned by at least one of gate location or active region.

5. The method of claim 1, wherein the passive devices of the second virtual group or the standard cells of the third virtual group are aligned based at least in part on a bounding box.

6. The method of claim 1, wherein the passive devices of the second virtual group are organized according to at least one of component type or component size.

7. The method of claim 1, wherein a genetic algorithm is applied to perform placement of the electronic design.

8. The method of claim 7, wherein a placement configuration corresponds to a data structure having a first portion comprising a virtual group order, a second portion comprising an instance order, a third portion comprising a virtual group direction, and a fourth portion comprising an instance direction.

9. The method of claim 7, wherein the genetic algorithm uses a wirelength cost model to determine a cost for each placement configuration.

10. The method of claim 1, wherein wirelength cost is considered to perform placement of the electronic design.

11. The method of claim 1, wherein the components of the electronic design are organized into a fourth virtual group that includes custom digital designs.

12. A non-transitory computer program product embodied on a computer readable medium, the computer readable medium having stored thereon a sequence of instructions which, when executed by a processor, executes a method comprising:
   receiving an electronic design;
   organizing components of the electronic design into multiple virtual groups, wherein a first virtual group is organized to include all active devices from the electronic design, a second virtual group is organized to include all passive devices from the electronic design, and a third virtual group is organized to include all standard cells from the electronic design; and
   performing placement of the electronic design by separately placing components for each of the first, second, and third virtual groups according to placement and alignment rules for each of the respective virtual groups.

13. The computer program product of claim 12, wherein the active devices of the first virtual group are placed in a layout by organization into a first level virtual group according to a first level grouping criteria, and wherein active devices in the first level group are organized into one or more second level virtual groups based upon a second level grouping criteria.

14. The computer program product of claim 12, wherein the components are aligned by at least one of gate location or active region.

15. The computer program product of claim 12, wherein the passive devices of the second virtual group or the standard cells of the third virtual group are aligned based at least in part on a bounding box.

16. The computer program product of claim 12, wherein a genetic algorithm is applied to perform placement of the electronic design.

17. The computer program product of claim 12, wherein the components of the electronic design are organized into a fourth virtual group that includes custom digital designs.

18. A system for partitioning in a database system, comprising:
   a processor;
   a memory for holding programmable code; and
   wherein the programmable code includes instructions executable by the processor for receiving an electronic design; organizing components of the electronic design into multiple virtual groups, wherein a first virtual group is organized to include all active devices from the electronic design, a second virtual group is organized to include all passive devices from the electronic design, and a third virtual group is organized to include all standard cells from the electronic design; and performing placement of the electronic design by separately placing components for each of the first, second, and third virtual groups according to placement and alignment rules for each of the respective virtual groups.

19. The system of claim 18, wherein the active devices of the first virtual group are placed in a layout by organization into a first level virtual group according to a first level grouping criteria, and wherein active devices in the first level group are organized into one or more second level virtual groups based upon a second level grouping criteria.

20. The system of claim 18, wherein the components of the electronic design are organized into a fourth virtual group that includes custom digital designs.

* * * * *